United States Patent
Matsushita

(10) Patent No.: US 9,929,062 B2
(45) Date of Patent: Mar. 27, 2018

(54) ABNORMALITY PORTENT DETECTION SYSTEM AND METHOD OF MANUFACTURING SEMICONDUCTOR DEVICE

(71) Applicant: Toshiba Memory Corporation, Minato-ku (JP)

(72) Inventor: Hiroshi Matsushita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 36 days.

(21) Appl. No.: 14/835,846

(22) Filed: Aug. 26, 2015

(65) Prior Publication Data

US 2016/0293462 A1 Oct. 6, 2016

(30) Foreign Application Priority Data

Mar. 31, 2015 (JP) ................................. 2015-073188

(51) Int. Cl.
*H01L 21/66* (2006.01)
*G05B 23/02* (2006.01)

(52) U.S. Cl.
CPC .......... *H01L 22/20* (2013.01); *G05B 23/0283* (2013.01)

(58) Field of Classification Search
None
See application file for complete search history.

(56) References Cited

U.S. PATENT DOCUMENTS 8,831,922 B2 9/2014 Sakakibara et al.
2012/0226475 A1 9/2012 Asai

FOREIGN PATENT DOCUMENTS

| JP | 2008-116727 | 5/2008 |
| JP | 2011-59790 A | 3/2011 |
| JP | 2011-181666 | 9/2011 |
| JP | 2011-230634 | 11/2011 |
| JP | 2012-58890 A | 3/2012 |
| JP | 2012-186213 | 9/2012 |
| JP | 2013-8092 | 1/2013 |
| JP | 2013-41448 A | 2/2013 |

*Primary Examiner* — Duy T Nguyen
*Assistant Examiner* — Bo Bin Jang
(74) *Attorney, Agent, or Firm* — Oblon, McClelland, Maier & Neustadt, L.L.P.

(57) ABSTRACT

According to one embodiment, in an abnormality portent detection system, a collection unit time-sequentially collects plural kinds of parameters related to a state of an apparatus. A calculation unit calculates, while temporally changing a boundary between a first period and a second period in a time-sequential variation characteristic of each of plural kinds of parameters, a contribution rate of each of the plural kinds of parameters with respect to a transition from a first state of the apparatus before the boundary to a second state of the apparatus after the boundary. An extraction unit extracts, among the plural kinds of parameters, a parameter showing a change in which the contribution rate has a maximum value at a timing before an abnormality occurrence timing of the apparatus with respect to a time of the boundary, based on a result of the calculation.

15 Claims, 10 Drawing Sheets

FIG.2
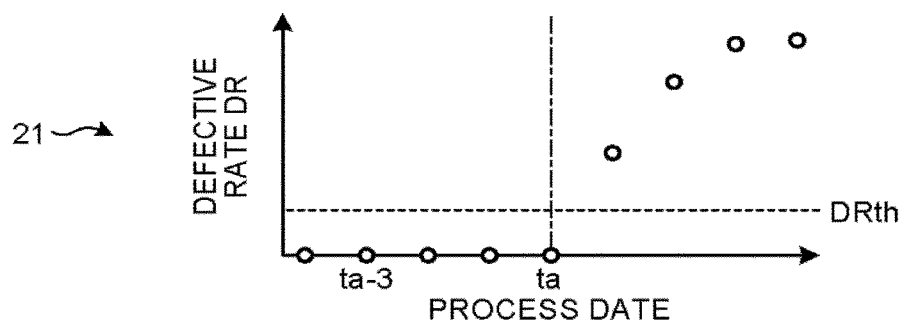
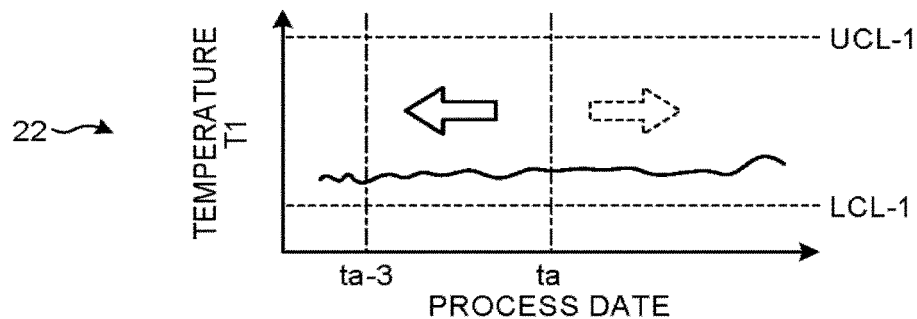
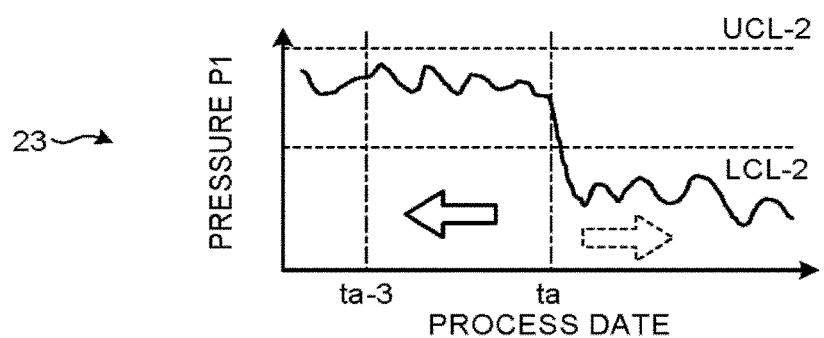
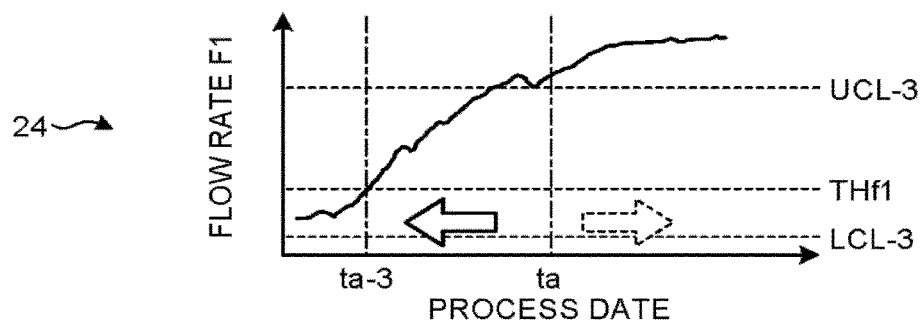

FIG.9
21 → 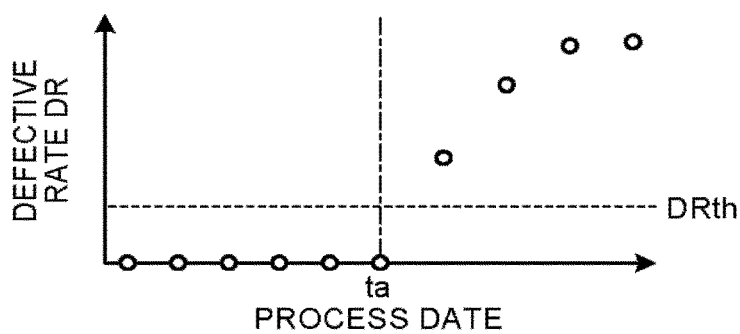
22 → 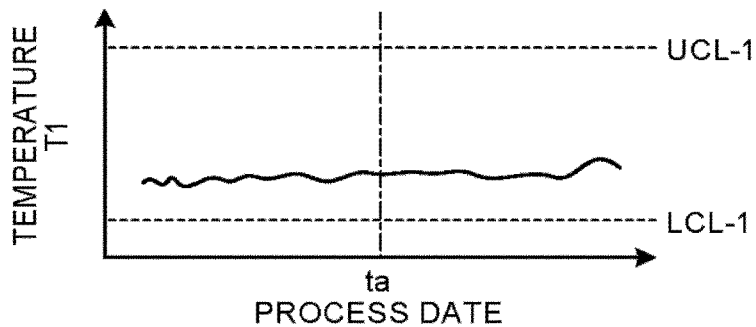
23 → 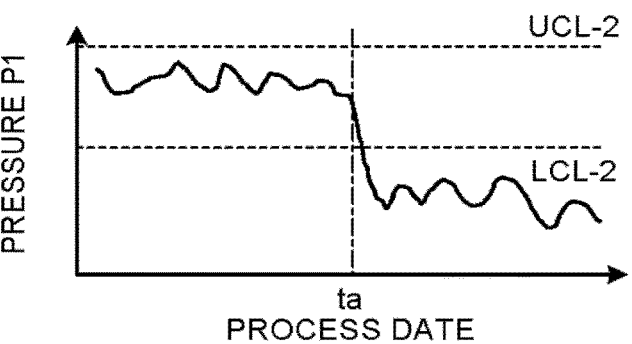
24 → 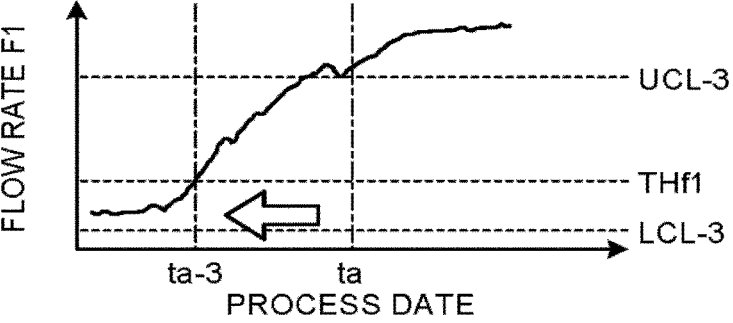
25 → 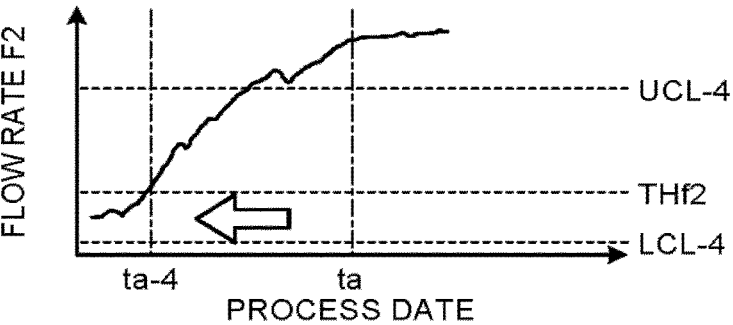

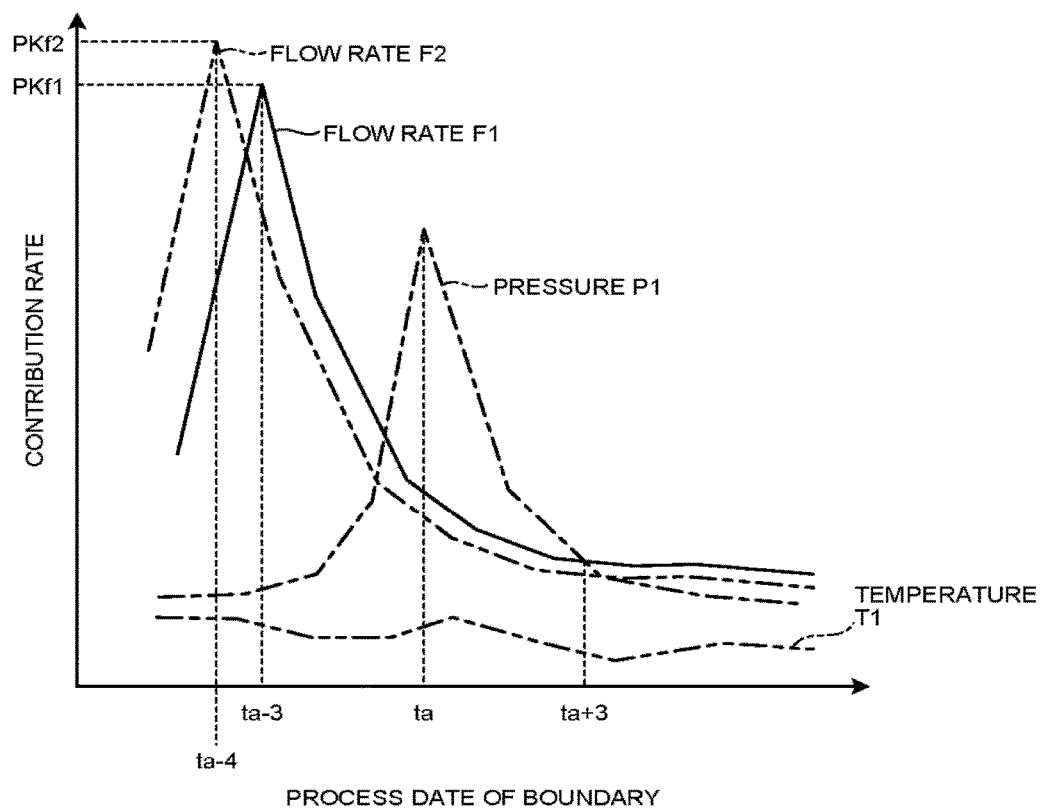

ABNORMALITY PORTENT DETECTION SYSTEM AND METHOD OF MANUFACTURING SEMICONDUCTOR DEVICE

CROSS-REFERENCE TO RELATED APPLICATIONS

This application is based upon and claims the benefit of priority front Japanese Patent Application No. 2015-073188, filed on Mar. 31, 2015; the entire contents of which are incorporated herein by reference.

FIELD

Embodiments described herein relate generally to an abnormality portent detection system and a method of manufacturing a semiconductor device.

BACKGROUND

In a process of manufacturing a semiconductor device, a substrate is processed by an apparatus to manufacture the semiconductor device. At this time, in order to appropriately manufacture the semiconductor device, it is desirable that a portent of an abnormality occurrence of the apparatus is detected and maintenance of the apparatus is performed.

BRIEF DESCRIPTION OF THE DRAWINGS

FIG. 2 is a diagram illustrating time-sequential variation characteristics of parameters related to a state of an apparatus according to an embodiment;

FIG. 9 is a diagram illustrating time-sequential variation characteristics of parameters related to a state of an apparatus according to a modification of the embodiment;

FIG. 10 is a diagram illustrating a variation of a contribution rate with respect to a time (process date) of a boundary according to the modification of the embodiment;

FIG. 11 a diagram illustrating a data structure of portent parameter information according to the modification of the embodiment.

DETAILED DESCRIPTION

In general, according to one embodiment, there is provided an abnormality portent detection system including a collection unit, a calculation unit, an extraction unit, and a generation unit. The collection unit is configured to time-sequentially collect plural kinds of parameters related to a state of an apparatus which processes a substrate. The calculation unit is configured, while temporally changing a boundary between a first period and a second period in a time-sequential variation characteristic of each of the plural kinds of parameters, to calculate a contribution rate of each of the plural kinds of parameters with respect to a transition from a first state of the apparatus before the boundary to a second state of the apparatus after the boundary. The extraction unit is configured to extract, among the plural kinds of parameters, a parameter showing a change in which the contribution rate has a maximum value at a timing before an abnormality occurrence timing of the apparatus with respect to a time of the boundary, based on a result of the calculation by the calculation unit. The generation unit is configured to generate portent parameter information with which the extracted parameter is associated as a parameter to be used to detect a portent of an abnormality occurrence of the apparatus.

Exemplary embodiments of an abnormality portent detection system will be explained below in detail with reference to the accompanying drawings. The present invention is not limited to the following embodiments.

Embodiment

Figure 1:
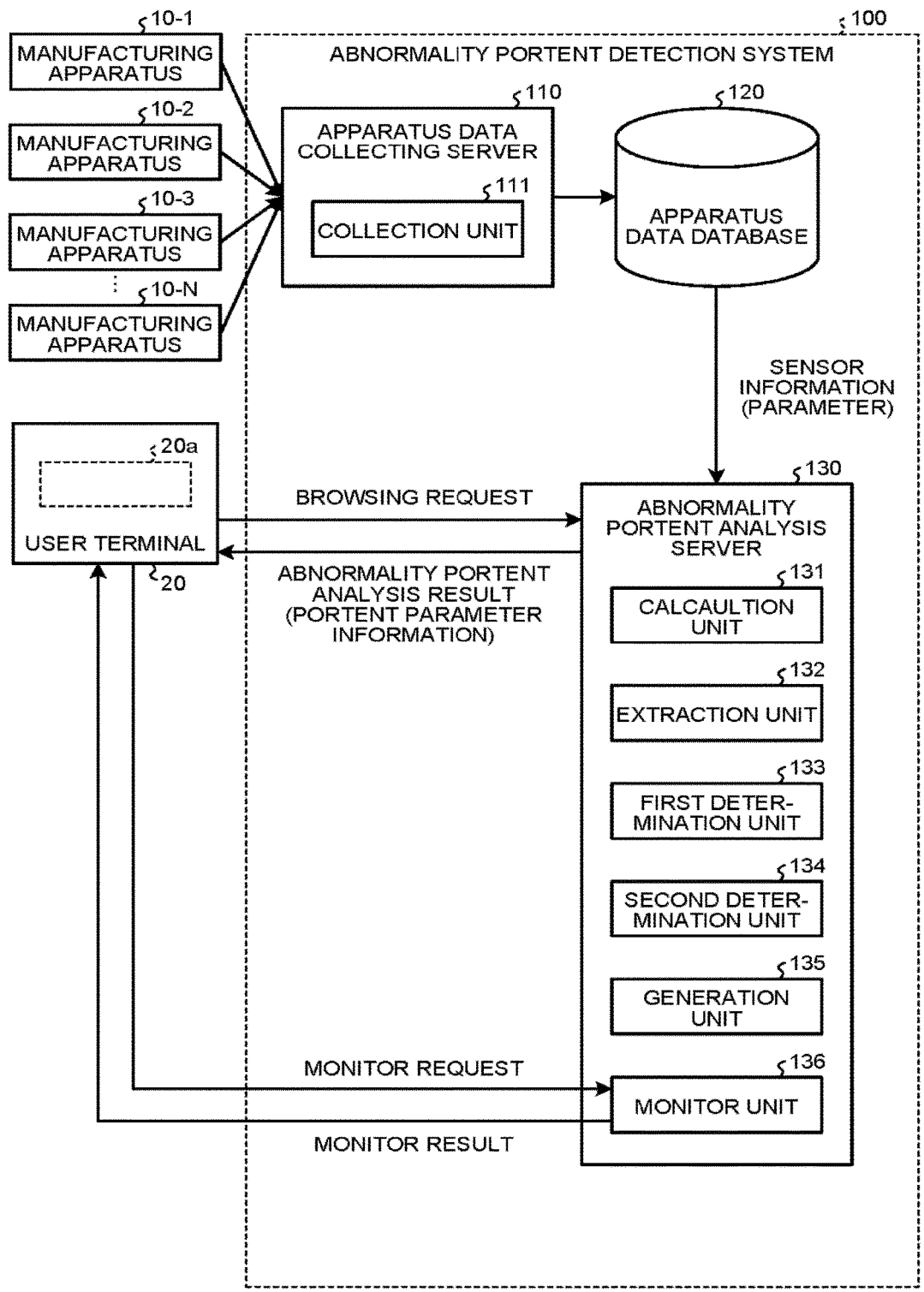
FIG. 1 is a diagram illustrating a configuration of an abnormality portent detection system according to an embodiment.

An abnormality portent detection system 100 according to the embodiment will be described using FIGS. 1 and 2. FIG. 1 is a diagram illustrating a configuration of the abnormality portent detection system 100. FIG. 2 is a diagram illustrating time-sequential variation characteristics 21 to 24 of parameters related to a state of a manufacturing apparatus 10.

The abnormality portent detection system 100, for example, is applied to a manufacturing process of a semiconductor device. In the manufacturing process of the semiconductor device, various manufacturing apparatuses 10-1 to 10-N (N is an integer of 4 or more) are used. Each manufacturing apparatus 10 treats a substrate (for example, a semiconductor substrate). Various manufacturing apparatuses 10-1 to 10-N, for example, include a film forming apparatus, a lithography apparatus, an etching apparatus, an injection apparatus, a polishing apparatus, and a heat processing apparatus. The film forming apparatus forms a film on a substrate. The lithography apparatus includes a coating apparatus which coats a photosensitive material onto the substrate, an exposure apparatus which exposes the substrate, and a develop apparatus which develops a latent image formed in the photosensitive material onto the substrate. The etching apparatus includes a dry etching apparatus, a wet etching apparatus, and the like. The injection apparatus injects ions into the substrate. The polishing apparatus performs a chemical mechanical polishing on the substrate. The heat processing apparatus performs heat treatment on the substrate.

In the manufacturing method of the semiconductor device, the substrate is subjected to hundreds of processes while using various manufacturing apparatuses 10-1 to 10-N, and a semiconductor integrated circuit is manufactured in the substrate. At this time, even in a case where an abnormality occurs in only one manufacturing apparatus 10 of the manufacturing apparatuses 10-1 to 10-N, the manufactured semiconductor integrated circuit does not operate as whole, so that the semiconductor device containing the semiconductor integrated circuit may be a defective product. Therefore, it is desired to manage each manufacturing apparatus 10 about the abnormality occurrence. The cause of the abnormality occurrence of the manufacturing apparatus 10 tends to mostly occur by degradation of a consumable part in the manufacturing apparatus 10.

For example, the film forming apparatus performs a film forming process by introducing various types of gas necessary for the processes into a vacuum chamber. In a case where the vacuum chamber is not sufficiently sealed up, the apparatus enters an abnormal state called a "chamber leak", and a defective film quality occurs so that a gas atmosphere necessary for the film formation is not maintained. In the case of the "chamber leak" trouble, a rubber part (a consumable part) having O-ring in which the hermeticity of the vacuum chamber is kept is gradually degraded as a use period is lengthened, and when the degradation exceeds a predetermined level, leak trouble occurs. Therefore, in the manufacturing apparatus 10 such as the film forming apparatus, the consumable part having the O-ring is replaced at every certain recommended replacement period taking a margin. This is called "preventive maintenance" in a sense of preventing an abnormality occurrence of the manufacturing apparatus 10.

In the preventive maintenance, since the consumable part is replaced at every certain recommended replacement period, in a case where an actual lifetime of the consumable part is short than that of the recommended replacement period, the substrate processed by the manufacturing apparatus 10 is likely to cause a quality abnormality in which the defective rate DR exceeds a threshold DRth (a yield is lowered to be less than a threshold) (see the variation characteristic 21 of FIG. 2). When the quality abnormality occurs, a manufacturing cost of the semiconductor device is likely increased.

Alternatively, since the consumable part is replaced at every certain recommended replacement period in the preventive maintenance, in a case where the actual lifetime of the consumable part is longer than the recommended replacement period, the consumable part which can be still used is discarded. In other words, since a running cost of the consumable part becomes larger unnecessarily, there a room for an improvement in effective use of the consumable part.

Therefore, it considered that a number (for example, several hundreds) of sensors are attached to each manufacturing apparatus 10, and sensor information (parameters) output from the respective sensors is collected to monitor the apparatus. For example, there are acquired the parameters indicating physical statuses such as a temperature, a gas flow rate, and a pressure. By checking these parameters, it is possible to confirm whether there is an abnormality in the operation status of the manufacturing apparatus 10.

For example, in a case where a range of values obtainable in a normal operation status of a certain sensor is found out, a monitor threshold is set in that range, and a structure is established to inform an abnormality when the value exceeds the monitor threshold, so that an abnormality of the manufacturing apparatus can be monitored. In each parameter, there are provided an upper control limit (UCL) and a lower control limit L. For example, a temperature T1, a pressure P1, and a flow rate F1 are set by upper control limits UCL-1, UCL-2, and UCL-3 and lower control limit LCL-1, LCL-2, and LCL-3 (see the variation characteristics 22 to 24 of FIG. 2), respectively. It, is possible to monitor whether each parameter deviates from a normal range between the upper control limit UCL and the lower control limit. LCL.

However, in a case where the degradation of the consumable part proceeds in a stepped manner, the parameter falls within the normal range defined by the upper control limit UCL and the lower control limit LCL in many cases. In this case, a user (a monitoring staff) cannot actually monitor the progressing of the degradation of the consumable part through a user terminal 20. When the parameter deviates from the upper control limit UCL and the lower control limit LCL, the degradation of the consumable part is progressed to an unallowable degree, and a defect occurs in a semiconductor product. In addition, there may be a parameter indicating a portent behavior in accordance with the stepwise degradation of the consumable part. When an appropriate upper control limit UCL and an appropriate lower control limit LCL are determined for the parameter indicating such a portent behavior, the degradation of the consumable part can be detected before the defect of the product is actualized. However, the parameter indicating the portent behavior is a part of a number (for example, several hundreds) of sensors output from the apparatus, and the most parameters tend to show no portent behavior.

In this embodiment, the abnormality portent detection system 100 changes a boundary of an abnormality occurrence period to be shifted from an actual abnormality occurrence timing, and extracts a parameter showing a change where a contribution rate to a transition from a state before the boundary to a state after the boundary of the manufacturing apparatus 10 is maximized before the abnormality occurrence timing. Therefore, a parameter (a monitoring item) to be used to detect a portent of the abnormality occurrence of the manufacturing apparatus 10 is extracted, and the portent of the abnormality occurrence of the manufacturing apparatus 10 is effectively detected.

Specifically, as illustrated in FIG. 1, the abnormality portent detection system 100 includes an apparatus data collecting server 110, an apparatus data database 120, and an abnormality portent analysis server 130.

The apparatus data collecting server 110 includes a collection unit 111. The collection unit 111 may be realized in hardware as a circuit in the apparatus data collecting server 110, or may be realized in software as a functional module which is developed in the apparatus data collecting server 110. The collection unit 111 collects plural kinds of sensor information (plural kinds of parameters) related to a state of each manufacturing apparatus 10. In each manufacturing apparatus 10, a plurality (for example, several hundreds) of sensors are provided.

The plural kinds of parameters related to the state of the manufacturing apparatus 10 are collected from respective sensors. For example, physical statuses such as a temperature, a gas flow rate, and a pressure are collected. In addition, the plural kinds of parameters regarding each physical status are collected. For example, temperature sensors are attached to various places of the manufacturing apparatus 10, and the temperatures of various places are collected as the plural kinds of parameters. Pressure sensors are attached to various places of the manufacturing apparatus 10, and the pressures of various places are collected as the plural kinds of parameters. Flow rate sensors are attached to various places of the manufacturing apparatus 10, and gas flow rates of various places are collected as the plural kinds of parameters.

The collection unit 111 collects the plural kinds of parameters from a plurality of sensors provided in each manufacturing apparatus 10 through a wired or wireless communication line. The collection unit 111 can collect the plural kinds of parameters of each manufacturing apparatus 10, and for example, can collect the plural kinds of parameters in association with an identifier of the manufacturing apparatus 10. The plural kinds of parameters are parameters to be used in multivariate analysis.

For example, the collection unit 111 can collect a signal (for example, a signal indicating a temperature of a substrate stage) of a temperature T1 from a sensor (the temperature sensor) as illustrated in the variation characteristic 22 of FIG. 2. In the variation characteristic 22, the vertical axis indicates a level of the signal of the temperature T1, and the horizontal axis indicates a process date (for example, a date when a process is performed). The signal of the temperature T1 falls within the normal range between the upper control limit UCL-1 and the lower control limit LCL-1 before and after the process date 'ta'.

For example, the collection unit 111 can collect a signal (for example, a signal indicating the pressure in the vacuum chamber) of the pressure P1 from a sensor (the pressure sensor) as illustrated in the variation characteristic 23 of FIG. 2. In the variation characteristic 23, the vertical axis illustrates a level of the signal of the pressure F1, and the horizontal axis illustrates a process data (for example, a date when the process is performed). The signal of the pressure P1 fails within the normal range between the upper control limit UCL-2 and the lower control limit LCL-2 before the process date 'ta'. The signal of the pressure P1 is lowered below the lower control limit LCL-2 and goes outside the normal range immediately after the process date 'ta'.

For example, the collection unit 111 can collect a signal (for example, a signal indicating a flow rate of a process gas flowing through a gas supply pipe) of the flow rate F1 from a sensor (the flow rate sensor) as illustrated in the variation characteristic 24 of FIG. 2. In the variation characteristic 24, the vertical axis indicates a level of the signal of the flow rate F1, and the horizontal axis indicates a process data (for example, a date when the process is performed). The signal of the flow rate F1 falls within the normal range between the upper control limit UCL-3 and the lower control limit LCL-3 before the process date 'ta'. The signal of the flow rate F1 exceeds the upper control limit UCL-3 at the process date 'ta' and goes outside the normal range.

The collection unit 111 transmits the plural kinds of parameters of the manufacturing apparatus 10 to the apparatus data database 120 through a wired or wireless communication line.

When the plural kinds of parameters of each manufacturing apparatus 10 are received from the collection unit 111, the apparatus data database 120 stores the plural kinds of parameters in each manufacturing apparatus 10. In other words, the plural kinds of parameters are stored in association with the identifier of the manufacturing apparatus 10.

The abnormality portent analysis server 130 acquires the plural kinds of sensor information (the plural kinds of parameters) of each manufacturing apparatus 10 from the apparatus data database 120 through a wired or wireless communication line and performs the multivariate analysis. As the multivariate analysis, for example, a partial least square discriminant analysis (PLS-DA) may be employed. In addition, the abnormality portent analysis server 130 may perform a monitor process of detecting the portent of the abnormality occurrence of each manufacturing apparatus 10 using a result of the multivariate analysis.

The abnormality portent analysis server 130 includes a calculation unit 131, an extraction unit 132, a first determination unit 133, a second determination unit 134, a generation unit 135, and a monitor unit 136. The calculation unit 131, the extraction unit 132, the first determination unit 133, the second determination unit 134, the generation unit 135, and the monitor unit 136 each may be realized in hardware as circuits in the abnormality portent analysis server 130, or may be realized in software as functional modules which are developed in the abnormality portent analysis server 130.

The calculation unit 131 receives the plural kinds of parameters acquired by the abnormality portent analysis server 130, and for each manufacturing apparatus 10, calculates the contribution rates of the plural kinds of parameters with respect to the transition from the normal state of the manufacturing apparatus 10 to the abnormal state of the manufacturing apparatus 10. The normal state and the abnormal state of the manufacturing apparatus 10 are determined based on a result of an inspection performed on the substrate.

For example, a plurality of chip areas are disposed in the substrate, and the processes of the manufacturing apparatus 10 on the substrate can be collectively or separately performed on the plurality of chip areas. Then, the substrate completed in the semiconductor manufacturing process in a clean room is subjected to an inspection for checking whether a semiconductor integrated circuit having a desired performance can be formed in each chip area. The inspection is performed for checking whether at least two or more chip areas among the plurality of chip areas in the substrate satisfy a reference of a desired performance (that is, good or defective). As a result of the inspection, a defective rate DRsub of the substrate is obtained by Equation 1 for example.

$$DRsub = (\text{Number of defective chip areas})/(\text{Number of examined chip areas}) \quad \text{Equation 1}$$

Then, the defective rates DRsub of a plurality of substrates processed at the same date are averaged and the defective rates DR of the manufacturing apparatuses 10 at each process date (a date where the process is performed) are obtained and plotted. For example, the variation characteristic 21 of FIG. 2 is obtained.

In the variation characteristic 21 of FIG. 2, the defective rate DR falls within the threshold DRth or below, before the process date 'ta'. The defective rate DR exceeds the threshold DRth immediately after the process date 'ta'. In other words, since the quality abnormality occurs immediately after the process date 'ta', the process date 'to' can be determined as the abnormality occurrence timing of the manufacturing apparatus 10, and the state of the manufacturing apparatus 10 before the process date 'ta' can be determined as the normal state, and the state of the manufacturing apparatus 10 after the process date 'to' can be determined as the abnormal state. In addition, the period before the process date 'ta' can be considered as a normal period, the period after the process date 'ta' can be considered as the abnormality occurrence period, and the process date 'ta' can be considered as the boundary between the normal period and the abnormality occurrence period.

It should be noted that, in a case where there are generated many substrates (that is, defective substrates of which the defective rate exceeds the threshold DRth) containing many chip areas having no desired performance, a statistical test may be performed to determine whether these substrates are processed in a specific manufacturing apparatus in each process of manufacturing the semiconductor. This test may be performed by a method in which ID of each defective substrate and process apparatus history data of each defective substrate are subjected to a chi-square test. Therefore, for example, in a case where it turns out that each defective substrate is intensively processed in a specific film forming apparatus of the film forming process, it is possible to specify that the O-ring in which the hermeticity of the vacuum chamber is held is degraded and the chamber leak occurs by checking the film forming apparatus. Then, due to the chamber leak trouble, it is not possible to keep a gas atmosphere necessary for the film formation, a film formation abnormality occurs, and finally it can be specified that the defect is actualized as the quality abnormality in a form of a yield abnormality.

Herein, in the PLS-DA analysis using the sensor information (parameter), a parameter having a large contribution rate may be extracted from among the plural kinds of sensor information (the plural kinds of parameters). At this time, a first method which focuses on the extraction of an item changing at the abnormality occurrence timing may be considered. In the first method, as an item (parameter) has a larger difference of a sensor behavior before and after the abnormality occurrence timing, a parameter having a large significant difference and having a larger contribution rate is extracted. For example, in the case of FIG. 2, since the pressure P1 indicating the variation characteristic 23 is largely changed before and after the process date 'ta', the pressure P1 becomes a parameter having a large contribution rate to the transition from the normal state to the abnormal state. In other words, in a model in which the upper control limit UCL and the lower control limit LCL of each parameter are determined based on a result of the inspection performed after the process on the substrate and the abnormality occurrence is monitored by monitoring whether the parameter deviates from the normal range between the upper control limit UCL and the lower control limit LCL, the abnormality of the manufacturing apparatus 10 is not possible to be detected until the quality abnormality occurs.

In the case of the sensor information (parameter) containing the portent behavior of the above-mentioned quality abnormality, the information tends to be largely changed before a time of occurrence of the quality abnormality, that is, in the normal period. Therefore, regarding the parameter containing the portent behavior, the significant difference between the normal period and the abnormality occurrence period is easily decreased, and the contribution rate is easily decreased. Accordingly, in the first method in which an item changing in a quality abnormality occurrence period (the abnormality occurrence timing) is extracted, the item (parameter) having the portent behavior of the abnormality occurrence tends to be not possible to be extracted.

On the contrary, in this embodiment, as illustrated with a solid or dashed white arrow in FIG. 2, the calculation unit 131 calculates the contribution rate while temporally changing the boundary between the normal period and the abnormality occurrence period in the time-sequential variation characteristics 22 to 24 of the plural kinds of parameters. In other words, the contribution rate is calculated while simulatively changing the normal period and the abnormality occurrence period and simulatively changing the normal state and the abnormal state of the manufacturing apparatus 10.

Figure 3A:
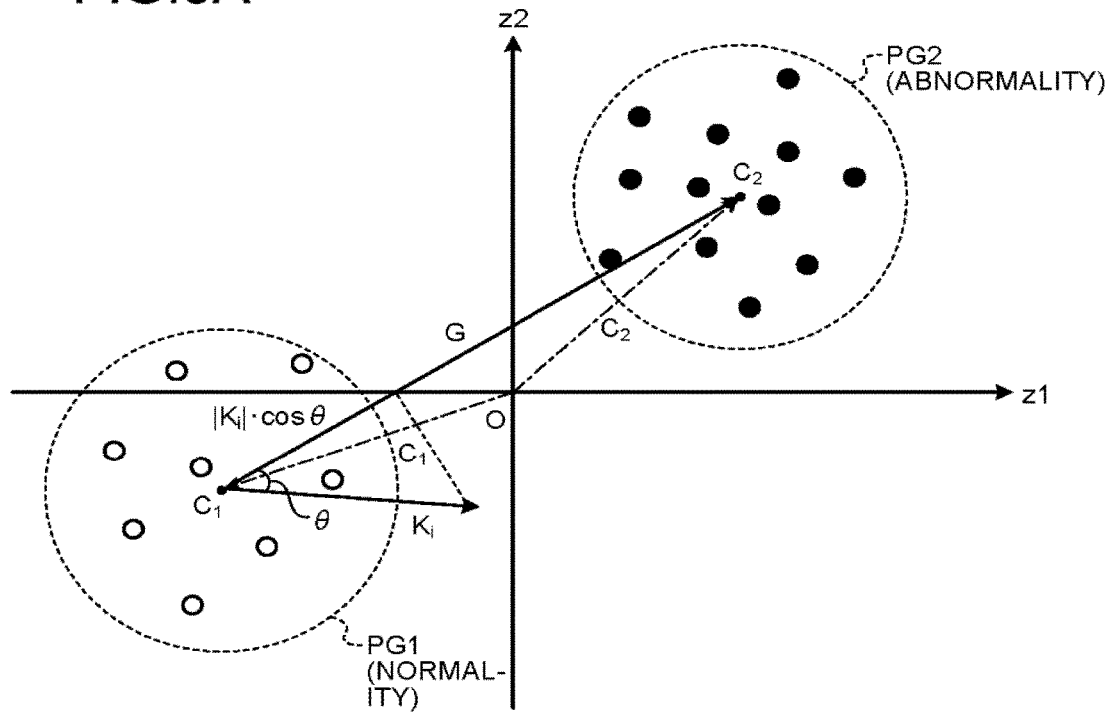
FIGS. 3A and 3B are diagrams illustrating a contribution rate of a PLS-DA analysis according to an embodiment.
Figure 3B:
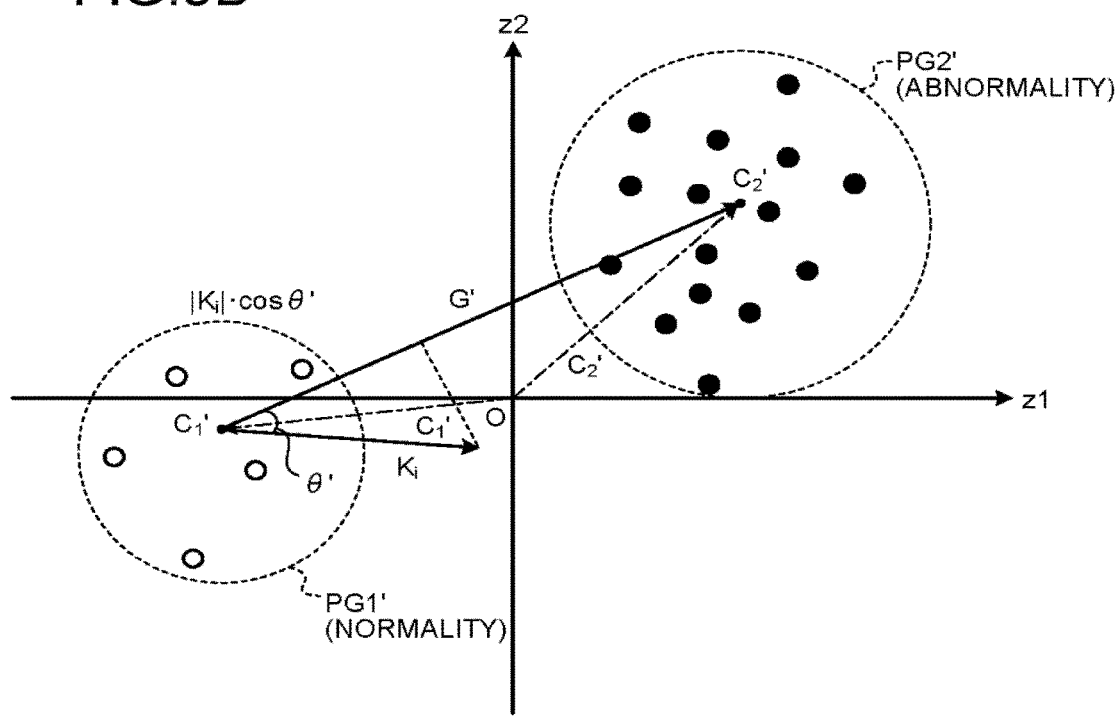

More specifically, the contribution rate is calculated according to a procedure of the PLS-DA analysis as illustrated in FIGS. 3A and 3B. FIG. 3A is a diagram illustrating a principle component analysis result in a case where the boundary between the normal period and the abnormality occurrence period is the abnormality occurrence timing, and a method of calculating the contribution rate. FIG. 3B is a diagram illustrating the principle component analysis result in a case where the boundary between the normal period and the abnormality occurrence period is earlier than the abnormality occurrence timing, and a method of calculating the contribution rate.

The sensor information (parameter) acquired from the manufacturing apparatus 10, for example, includes hundreds of items to thousands of items. Through the principle component analysis on the plural kinds of sensor information (the plural kinds of parameters), it is possible to integrate the variables into a few variables called the principle components. The principle component analysis is a type of variable transform (coordinate transform) in which a linear transform to suppress (for example, minimize) the lacking of information can be defined.

For example, when the values of the plural kinds of parameters each are expressed as variables p1, p2, pn, a plurality of principle components z1 and z2 each can be defined by Equations 2 and 3.

$$z1=a1*p1+a2*p2+\ldots+an*pn \quad \text{Equation 2}$$

$$z2=b1*p1+b2*p2+\ldots+bn*pn \quad \text{Equation 3}$$

By Equations 2 and 3, since the n-dimensional coordinate space (for example, hundreds-dimensional space) of the variables p1, p2, . . . , pn can be transformed in coordinate to a two-dimensional coordinate space of the primary components z1 and z2, a vector in the coordinate space can be intuitively grasped with ease. In Equations 2 and 3, the respective coefficients a1, a2, . . . , an, b1, b2, . . . , and bn are determined to suppress (for example, minimize) the lacking of information at the time of the coordinate transform "the n-dimensional coordinate space→the two-dimensional coordinate space".

It should be rioted that, the principle component z1 and the principle component z2 may be called a first principle component and a second principle component, respectively. The values p1, p2, . . . , pn of the respective parameters are subjected to normalization to have an average of 0 and a variance of 1. The principle component can be defined by the number of sensors (the number of kinds of the parameters), but herein by the first and second principle components are considered.

An example of the principle component analysis results in a case where the boundary between the normal period and the abnormality occurrence period is the abnormality occurrence timing is illustrated in FIG. 3A. The horizontal axis indicates the first principle component z1, and the vertical axis indicates the second principle component z2. When the principle component values of the respective process data are plotted on the principle component coordinate space, as illustrated in FIG. 3A, a distribution PG1 of the principle component values in the normal state is separated from a distribution PG2 of the principle component values in the abnormal state. In the case of FIG. 3A, the distribution PG1 of the principle component values in the normal state corresponds to the respective parameters earlier than the abnormality occurrence timing ta (see FIG. 2). The distribution PG2 of the principle component values in the abnormal state corresponds to the value of the respective parameters later than the abnormality occurrence timing 'ta'.

The distribution PG1 of the principle component values in the normal state can be representative by a vector C1 extending from the origin O of the coordinate space to a gravity-center point C1 of the distribution PG1. The coordinate values of the gravity-center point C1 can be obtained by averaging the coordinate values of the respective coordinate points belonging to the distribution PG1. The distribution PG2 of the principle component values in the abnormal state can be representative by a vector C2 extending from the origin O of the coordinate space to a gravity-center point C2 of the distribution PG2. The coordinate values of the gravity-center point C2 can be obtained by averaging the coordinate values of the respective coordinate points belonging to the distribution PG2. The transition from the normal state to the abnormal state can be representative by a vector G extending from the gravity-center point C1 of the distribution PG1 of the principle component values in the normal state to the gravity-center point C2 of the distribution PG2 of the principle component values in the abnormal state. In other words, the vector G indicating the transition from the normal state to the abnormal state can be obtained by the following Equation 4.

$$G = C2 - C1 \qquad \text{Equation 4}$$

The movement on the principle component coordinate space when the value pi ($1 \le i \le n$, i is an integer) of a certain sensor information (parameter) is changed from 0 to 1 can be represented by a vector Ki as illustrated in FIG. 3A. The vector Ki can be obtained using the coefficient used in the transform to the principle component as expressed in the following Equation 5.

$$Ki = (ai, bi)(1 \le i \le n, i \text{ is an integer}) \qquad \text{Equation 5}$$

At this time, a contribution rate Cont(i) of the sensor information (parameter) pi to the transition from the normal state to the abnormal state is given by a ratio between the magnitude of a projection component of the vector Ki in a direction of the vector G and the magnitude of the vector G as shown in the following Equation 6.

$$\text{Cont}(i) = |Ki| \cdot \cos \theta / |G| \qquad \text{Equation 6}$$

In Equation 6, θ is an angle formed between the vector G and the vector Ki. Referring to Equation 6, it can be seen that the contribution rate of the manufacturing apparatus 10 to the transition from the normal state to the abnormal state becomes higher as the sensor information (parameter) is increased in the magnitude of the vector Ki and the directions of the vector G and the vector Ki are aligned.

For example, an example of the principle component analysis result in a case where the boundary between the normal period and the abnormality occurrence period is earlier than the abnormality occurrence timing is illustrated in FIG. 3B. When the boundary between the normal period (a pseudo normal period) and the abnormality occurrence period (a pseudo abnormal period) is earlier than the abnormality occurrence timing, a distribution PG1' of the principle component values in the normal state (a pseudo normal state) and a distribution PG2' of the principle component values in the abnormal state (a pseudo abnormal state) are changed. Since a vector C1' indicating the distribution PG1' of the principle component values in the normal state and a vector C2' indicating the distribution PG2' of the principle component values in the abnormal state each are changed, a vector G' indicating the transition from the normal state to the abnormal state is also changed. In other words, the vector G' indicating the transition from the normal state to the abnormal state can be obtained by the following Equation 7.

$$G' = C2' - C1' \qquad \text{Equation 7}$$

Similarly to the case of FIG. 3A, the movement on the principle component coordinate space when the value pi ($1 \le i \le n$, i is an integer) of a certain sensor information (parameter) is changed from 0 to 1 can be represented by the vector Ki. However, since the vector G' is changed, a contribution rate Cont'(i) is changed as expressed in the following Equation 8.

$$\text{Cont}'(i) = |Ki| \cdot \cos \theta' / |G'| \qquad \text{Equation 8}$$

In Equation 8, θ' is an angle formed between the vector G' and the vector Ki. For example, in the case of |G|=|G'|, when θ'<θ as illustrated in FIGS. 3A and 3B, the following Equation 9 is derived from Equations 6 and 8.

$$\text{Cont}'(i) > \text{Cont}(i) \qquad \text{Equation 9}$$

Referring to Equation 9, it can be seen that the contribution rate of the sensor information (parameter) pi is larger in a case where the boundary between the normal period and the abnormality occurrence period is earlier than the abnormality occurrence timing compared to a case where the boundary between the normal period and the abnormality occurrence period is the abnormality occurrence timing.

Returning to FIG. 1, the calculation unit 131 calculates, for each manufacturing apparatus 10, the respective contribution rates of the plural kinds of parameters with respect to the transition from the normal state to the abnormal state of the manufacturing apparatus 10 while temporally changing the boundary between the normal period and the abnormality occurrence period to the time-sequential variation characteristics of the plural kinds of parameters.

For example, as illustrated with the solid and dashed white arrows in FIG. 2, a process date of the boundary dividing normality/abnormality in order to perform the analysis (the calculation of the contribution rate) of the significant difference by the PLS-DA analysis is set before and after "ta". Then, the PLS-DA analysis (the calculation of the contribution rate) is repeatedly performed. In other words, classification boundaries of the PLS-DA analysis are set to a day ago "ta−1", two days ago "ta−2", three days ago "ta−3" before "ta", . . . , and a day later "ta+1", two days later "ta+2", three days later "ta+3" . . . after "ta". In other words, a plot before the boundary is classified into a class as a plot belonging to the normal state of the manufacturing apparatus 10, and a plot after the boundary is classified into a class as a plot belonging to the abnormal state of the manufacturing apparatus 10. Then, the contribution rate Cont(i,k) to the significant difference in a classified division of each $i^{th}$ sensor information (parameter) is calculated with respect to the boundary of each process date "ta+k" (k is an integer obtained from a positive, zero, or negative value). In other words, in a case where the boundary between the normal period and the abnormality occurrence period is set to the process date "ta+k" while changing a value of 'k', the calculation unit 131 calculates the contribution rate Cont(i, k) of each parameter to the transition from the normal state to the abnormal state of the manufacturing apparatus 10.

The calculation unit. 131 supplies a calculation result to the extraction unit 132. The calculation result includes information in which the contribution rate is associated with the identifier of the manufacturing apparatus 10, the identifier of the parameter, and the process date.

The extraction unit 132 extracts a parameter from the plural kinds of parameters based on the calculation result of the calculation unit 131. The extraction unit 132 extracts, among the plural kinds of parameters, a parameter showing a change where the contribution rate is maximized at a timing before the abnormality occurrence timing of the manufacturing apparatus 10 with respect to a time (the process date) of the boundary, based on the calculation result of the calculation unit. Therefore, it is possible to extract the sensor information (parameter) showing the portent behavior of the quality abnormality before the abnormality occurrence timing (that is, a parameter to be used to detect the portent of the abnormality occurrence of the manufacturing apparatus 10).

For example, as described before, the calculation result of the calculation unit 131 includes the information in which the contribution rate is associated with the identifier of the manufacturing apparatus 10, the identifier of the parameter, and the process date. Therefore, the extraction unit 132 can confirm a change of the contribution rate to a time (the process date) of the boundary as illustrated in FIG. 4 based on the calculation result of the calculation unit 131.

Figure 4:
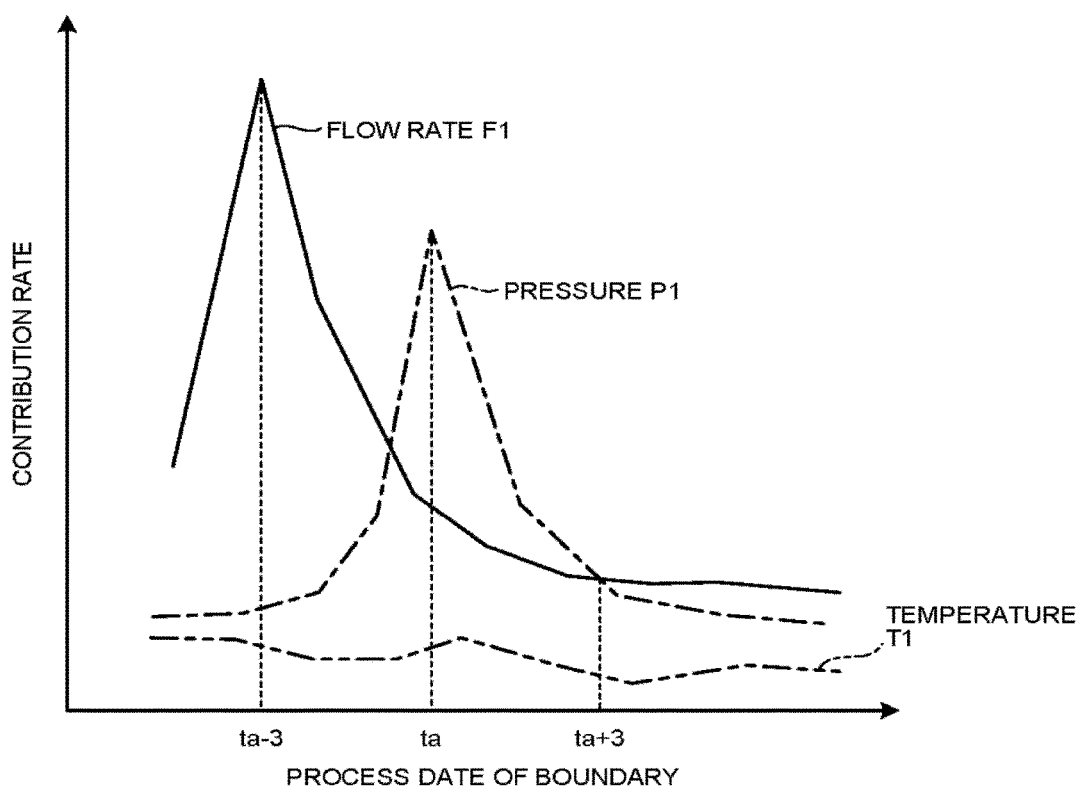
FIG. 4 is a diagram illustrating a variation of a contribution rate with respect to a time (process date) of a boundary according to an embodiment.

FIG. 4 is a diagram illustrating a change of the contribution rate to a time (the process date) of the boundary in the manufacturing apparatus 10-1 for example, in which the vertical axis represents the contribution rate and the horizontal axis represents the process date of the boundary. For example, it can be seen that the pressure P1 showing a large change at the abnormality occurrence timing (for example, immediately after the chamber leak trouble occurs) illustrated in FIG. 2 has a maximum contribution rate at the time of the process date 'ta'. The change shows an upwardly convex trend. In addition, it can be seen that the flow rate F1 has a maximum contribution rate at the process date 'ta−3' (for example, three days ago before the chamber leak trouble). The change also shows the upwardly convex trend.

In other words, in the case of FIG. 4, the flow rate F1 among the parameters T1, P1, and F1 shows a change in which the contribution rate has a maximum value at the timing (the process date 'ta−3') before the abnormality occurrence timing (the process date 'ta') of the manufacturing apparatus 10 with respect to the time (the process date) of the boundary. In other words, the flow rate F1 shows a change of forming an upwardly convex curve to have a peak value before the abnormality occurrence timing (the process date 'ta'). Such a change is not shown in the temperature T1 and the pressure P1. Therefore, in the case of FIG. 4, the extraction unit 132 extracts the flow rate F1 among the parameters T1, P1, and F1 as a parameter to be used to detect the portent of the abnormality occurrence of the manufacturing apparatus 10.

It should be noted that, in a case where there are two or more kinds of the parameters F1 and F2 showing a change in which the contribution rate has a maximum value at a timing before the abnormality occurrence timing with respect to the time of the boundary (see FIG. 10), the extraction unit 132 can extract a parameter P2 having the largest maximum value of the contribution rate. Therefore, it is possible to extract a parameter which shows the most prominent portent behavior of the abnormal occurrence of the manufacturing apparatus 10 among the parameters showing maximum values before the abnormality occurrence timing and which is easily monitored.

Alternatively, in a case where there are two or more kinds of the parameters F1 and F2 showing a change in which the contribution rate has a maximum value at a timing before the abnormality occurrence timing with respect to the time of the boundary (see FIG. 10), the extraction unit 132 can extract the parameter F1 of which the contribution rate has a timing of the maximum value nearest to the abnormality occurrence timing. Therefore, it is possible to extract a parameter which shows the portent behavior of the abnormality occurrence of the manufacturing apparatus 10 nearest to the abnormality occurrence timing among the parameters showing maximum values before the abnormality occurrence timing and which is suitable for reducing the running cost of the consumable part.

The extraction unit 132 supplies an extraction result to the first determination unit 133, the second determination unit 134, and the generation unit 135. The extraction result includes information in which the identifier of the extracted parameter is associated with the identifier of the manufacturing apparatus 10.

The first determination unit 133 acquires the calculation result from the calculation unit. 131, and acquires the extraction result from the extraction unit 132. The first determination unit 133 acquires the information on the value of the extracted parameter from the calculation result of the calculation unit 131. The first determination unit 133 determines a threshold for detecting a portent of the abnormal occurrence of the manufacturing apparatus 10 according to the value of the parameter at a timing of the maximum value of the contribution rate with respect to the parameter extracted by the extraction unit 132.

For example, in the case illustrated in FIG. 4, the flow rate F1 is extracted as a parameter to be used to detect the portent of the abnormality occurrence of the manufacturing apparatus 10. The timing of the maximum value of the contribution rate of the flow rate F1 is the process date 'ta−3' (that is, three days ago before the abnormality occurrence timing 'ta'). At this time, the first determination unit 133 determines a threshold THf1 such that the portent behavior is detected in the process date 'ta−3' in the variation characteristic 24 of the flow rate F1 as illustrated in FIG. 2. For example, in a case where the value of the parameter tends to be increased in the process date 'ta−3', the first determination unit 133 can determine a value between the parameter value in the process date 'ta−3' and the parameter value in the process date 'ta−4' as the upper limit threshold THf1 (a threshold to determine that there is a portent when the parameter exceeds the threshold). Alternatively, while not illustrated in the drawing, in a case where the value of the parameter tends to be lowered in the process date 'ta−3', the first determination unit 133 can determine a value between the parameter value in the process date 'ta−3' and the parameter value in the process date 'ta−4' as a lower limit threshold THf1 (a threshold to determine that there is a portent when the parameter is lower than the threshold).

As illustrated in FIG. 2, the threshold THf1, for example, can be a value in the normal range between the upper control limit UCL-3 and the lower control limit LCL-3. In other words, even when the parameter value falls within the normal range by the threshold THf1, the portent behavior of the abnormality occurrence illustrated by the flow rate F1 can be confirmed.

The first determination unit 133 supplies a first determination result to the generation unit 135. The first determination result includes information in which the determined threshold value i, associated with the identifier of the manufacturing apparatus 10 and the identifier of the parameter.

The second determination unit 134 acquires the calculation result from the calculation unit 131, and acquires the extraction result from the extraction unit 132. The second determination unit 134 acquires the information on the value of the extracted parameter from the calculation result of the calculation unit 131. The second determination unit 134 specific a timing of the maximum value of the contribution rate with respect to the extracted parameter. The second determination unit 134 determines a portent time from the timing at which the portent of the abnormality occurrence of the manufacturing apparatus 10 is detected to the abnormality occurrence timing based on the timing of the maximum value of the contribution rate and the abnormality occurrence timing.

For example, in the case illustrated in FIG. 4, the flow rate F1 is extracted as a parameter to be used to detect the portent of the abnormality occurrence of the manufacturing apparatus 10. The timing of the maximum value of the contribution rate of the flow rate F1 is the process date 'ta-3' (that is, three days ago before the abnormality occurrence timing ta). At this time, the second determination unit 134 can determine three days as the portent time (the number of portent days) from the timing at which the portent of the abnormality occurrence of the manufacturing apparatus 10 is detected to the abnormality occurrence timing.

The second determination unit 134 supplies a second determination result to the generation unit 135. The second determination result includes information in which the value of the determined portent time (the number of portent days) is associated with the identifier of the manufacturing apparatus 10 and the identifier of the parameter.

The generation unit 1 acquires the extraction result from the extraction unit 132, the first determination result from the first determination unit 133, and the second determination result from the second determination unit 134. The generation unit 135 generates portent parameter information 135a based on the extraction result, the first determination result, and the second determination result.

The portent parameter information 135a includes information in which the extracted parameter is associated as a parameter to be used to detect the portent of the abnormality occurrence of the manufacturing apparatus 10 (for example, information in which the identifier of the manufacturing apparatus 10 and the identifier of the parameter are associated with each other). In other words, the generation unit 135 associates the parameter as a parameter to be used to detect the portent of the abnormality occurrence by including the identifier of the parameter in the portent parameter information 135a. Then, the generation unit 135 associates the parameter with a detection target of the portent of the abnormality occurrence by associating the identifier of the manufacturing apparatus 10 with the identifier of the parameter.

In addition, the portent parameter information 135a includes information in which the extracted parameter is further associated with the threshold (for example, information in which the identifier of the parameter and the value of the threshold are associated with each other). In other words, the generation unit 135 associates the parameter with the threshold by associating the identifier of the parameter with the value of the threshold.

In addition, the portent parameter information 135a includes information in which the extracted parameter is further associated with the portent time (for example, information in which the identifier of the parameter and the value (the number of portent days) of the portent time are associated). In other words, the generation unit 135 associates the parameter with the portent time by associating the identifier of the parameter with the value of the portent time.

Figure 5:
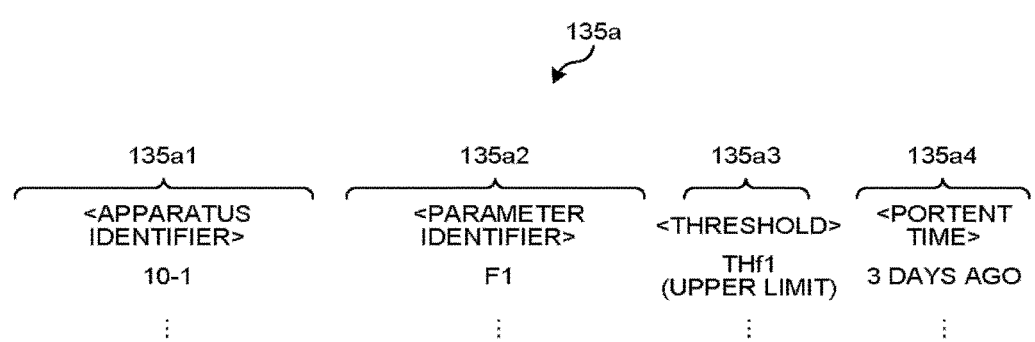
FIG. 5 is a diagram illustrating a data of portent parameter information according to an embodiment.

For example, the portent parameter information 135a includes a data structure as illustrated in FIG. 5. FIG. 5 is a diagram illustrating the data structure of the portent parameter information 135a. The portent parameter information 135a includes information in which the identifier of the manufacturing apparatus 10, the identifier of the parameter, the value of the threshold, and the value of the portent time are associated with each other. The portent parameter information 135a includes an apparatus identifier column 135a1, a parameter identifier column 135a2, a threshold column 135a3, and a portent time column 135a4. In the apparatus identifier column 135a1, the identifier of the manufacturing apparatus 10 (for example, the number of the manufacturing apparatus) is described. In the parameter identifier column 135a2, the identifier of the parameter is described. In the threshold column 135a3, the value of the threshold is described. In the portent time column 135a4, the value of the portent time (for example, the number of portent days) is described. When referring the portent parameter information 135a, for example, it can be seen that the upper limit, of the flow rate F1 is the threshold THf1 and the portent of the abnormality occurrence of the manufacturing apparatus 10-1 can be detected three days ago before the abnormality occurrence timing.

The generation unit 135 supplies the generated portent parameter information 135a to the monitor unit 136. In addition, when a browsing request is received from the user terminal 20 through a wired or wireless communication line, the generation unit 135 transmits the portent parameter information 135a to the user terminal 20 as an abnormality portent analysis result. Therefore, the portent parameter information 135a can be displayed on a display screen 20a of the user terminal 20, and the user can be informed.

It should be noted that the calculation unit 131, the extraction unit 132, the first determination unit 133, and the second determination unit 134 each may receive the browsing request from the user terminal 20 through a wired or wireless communication line, or may transmit an intermediate result of the abnormality portent analysis to the user terminal 20 in response to the browsing request.

When a monitor request is received from the user terminal 20 through a wired or wireless communication line, the monitor unit 136 begins to detect the portent of the abnormality occurrence of the manufacturing apparatus 10. In other words, the monitor unit 136 acquires the portent parameter information 135a from the generation unit 135, and detects the portent of the abnormality occurrence of the manufacturing apparatus 10 using the portent parameter information 155a. The monitor unit 136 specifies a parameter (portent parameter) to be used to detect the portent of the abnormality occurrence with reference to the portent parameter information 135a. The portent parameter is acquired from the plural kinds of parameters acquired by the abnormality portent analysis server 130. The monitor unit 136 specifies the threshold with reference to the portent parameter information 135a, and compares the portent parameter with the threshold. In a case where the threshold is the upper limit threshold, the monitor unit 136 determines that there is no portent when the value of the portent parameter is equal to or less than the threshold, and determines that there is a portent when the value of the portent parameter exceeds the threshold. The monitor unit 136 transmits a monitor result to the user terminal 20 through a wired or wireless communication line. Therefore, the monitor result can be displayed on the display screen 20a of the user terminal 20, and the user can be informed.

For example, upper limit threshold THf1 is set in the flow rate F1 the monitor process of the portent may be performed. At the time when the flow rate F1 exceeds the upper limit threshold THf1, the O-ring parts begin to be degraded and the replacement of these parts can be instructed to an operator at the work site without delay even though the film formation abnormality does not occurs. By taking this action, it is possible to prevent a decrease of the yield caused by the film formation abnormality in advance. In other words, it is possible to detect the portent of the quality abnormality by monitoring the flow rate F1 using the upper limit threshold THf1.

Figure 6:
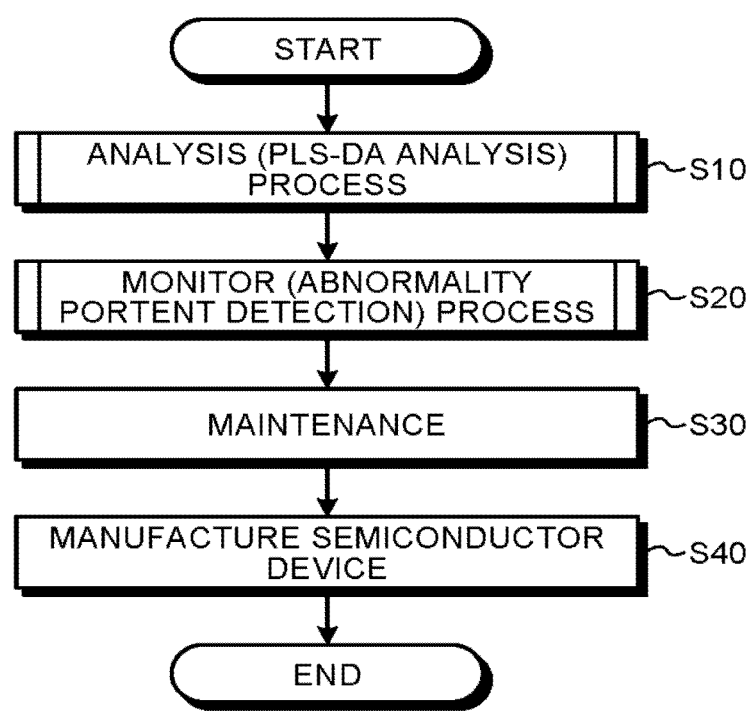
FIG. 6 is a flowchart illustrating a method of manufacturing a semiconductor device to which the abnormality portent detection system according to an embodiment is applied.
Figure 7:
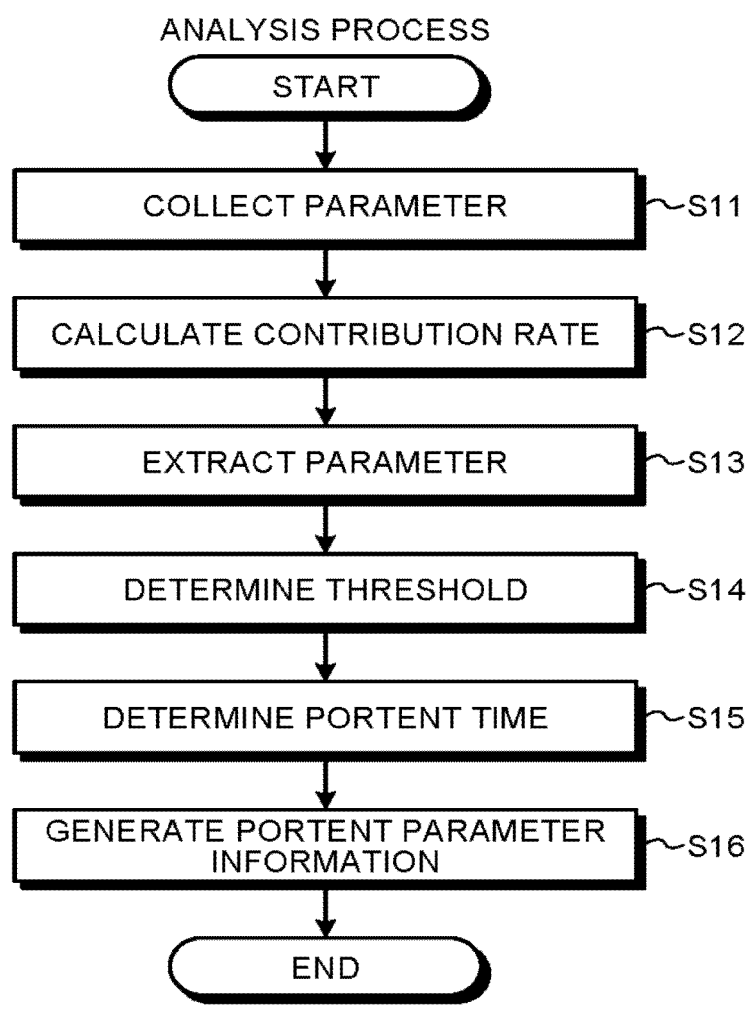
FIG. 7 is a flowchart illustrating an analysis process according to an embodiment.
Figure 8:
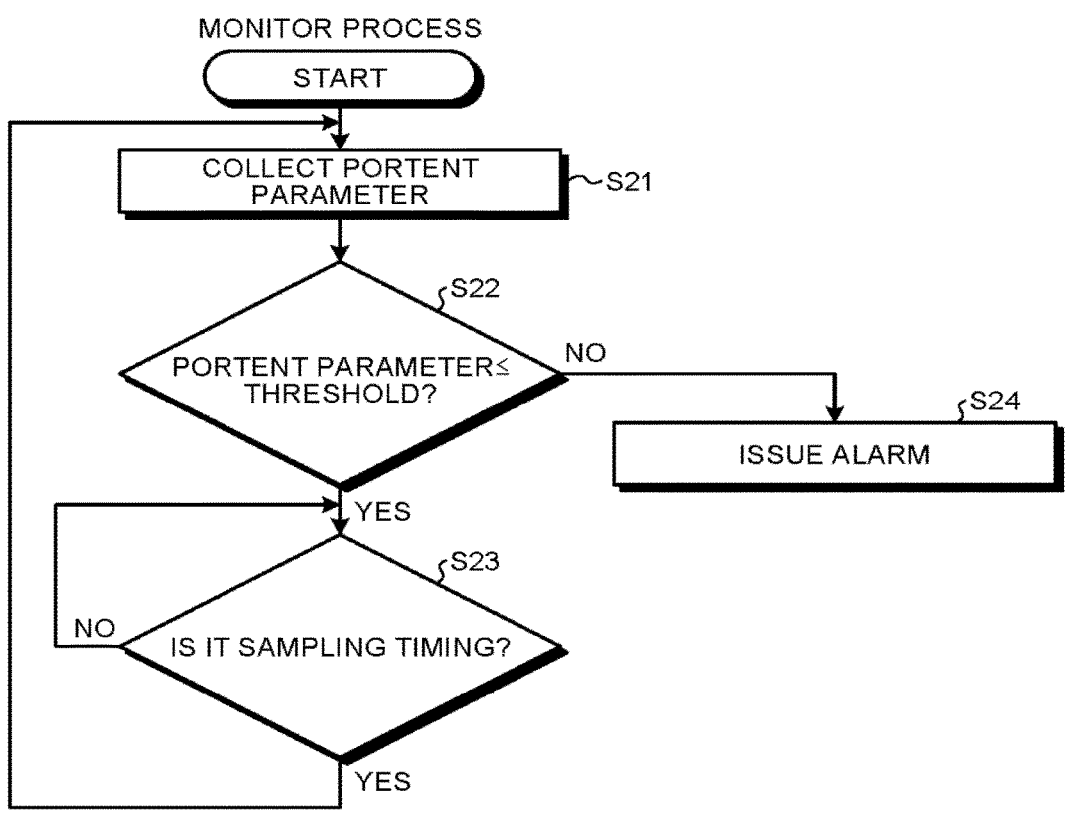
FIG. 8 is a flowchart illustrating a monitor process according to an embodiment.

Next, an example in which the abnormality portent detection system 100 is applied to a method of manufacturing of the semiconductor device will be described using FIGS. 6 to 8. FIG. 6 is a flowchart illustrating a method of manufacturing the semiconductor device to which the abnormality portent detection system 100 is applied. FIG. 7 is a flowchart specifically illustrating an analysis process performed by the abnormality portent detection system 100. FIG. 8 is a flowchart specifically illustrating the monitor process performed by the abnormality portent detection system 100.

For example, the abnormality portent detection system 100 performs the analysis process according to the PLS-DA analysis (S10).

Specifically, the abnormality portent detection system 100 collects the plural kinds of parameters of each manufacturing apparatus 10 (S11). The abnormality portent detection system 100 specifies the abnormality occurrence timing based on a result of the inspection on a substrate. The abnormality portent detection system 100 calculates the contribution rates of the plural kinds of parameters with respect to the transition from the normal state to the abnormal state of the manufacturing apparatus 10 while temporally changing the boundary between the normal period and the abnormality occurrence period from the abnormality occurrence timing in the time-sequential variation characteristics of the plural kinds of parameters (S12). The abnormality portent detection system 100 extracts, among the plural kinds of parameters, a parameter showing a change in which the contribution rate has a maximum value at a timing before the abnormality occurrence timing of the manufacturing apparatus 10 with respect to the time (the process date) of the boundary, based on the result calculated in S12 (S13). In this way, all the parameters to be used to detect the portent of the abnormality occurrence of the manufacturing apparatus 10 can be extracted. The abnormality portent detection system 100 determines a threshold which is used to detect the portent of the abnormality occurrence of the manufacturing apparatus 10 with respect to the parameter extracted (S14). The abnormality portent detection system 100 determines a portent time (the number of portent days) front the timing at which the portent of the abnormality occurrence of the manufacturing apparatus 10 is detected to the abnormality occurrence timing with respect to the parameter extracted in S13 based on the timing of the maximum value of the contribution rate and the abnormality occurrence timing (S15). The abnormality portent detection system 100 generates the portent parameter information 135*a* based on the parameter extracted in S13, the threshold determined in S14, and the portent time determined in S15 (S16).

The abnormality portent detection system 100 performs the monitor process of detecting the portent of the abnormality occurrence of the manufacturing apparatus 10 using the portent parameter information 135*a* (S20).

Specifically, the abnormality portent detection system 100 specifies a parameter (portent parameter) to be used to detect the portent of the abnormality occurrence with reference to the portent parameter information 135*a*, and collects the portent parameter for each manufacturing apparatus 10 (S21). The abnormality portent detection system 100 specifies a threshold with reference to the portent parameter information 135*a*, and compares the value of the portent parameter collected in S21 with the threshold (S22). In a case where the threshold is the upper limit threshold, when the value of the portent parameter is equal to or less than the threshold (Yes in S22), the abnormality portent detection system 100 determines that there is no portent, waits for a sampling timing (No in S23), and returns to the process of 321 when the sampling timing comes (Yes in S23). When the value of the portent parameter exceeds the threshold (No in S22), the abnormality portent detection system 100 determines that there is a portent, and issues an alarm of the portent toward the user (S24).

It should be noted that, in a case where the threshold of the portent parameter is the lower limit threshold, the flowchart illustrated in FIG. 8 can be similarly employed when the sign "≤" in S22 of FIG. 8 is replaced with "≥".

Then, when the alarm of the portent is the user performs maintenance (repairs, and the like) of the manufacturing apparatus 10 (S30). Then, the semiconductor device is manufactured using the manufacturing apparatus 10 subject to the maintenance (S40).

As described above, in the embodiment, the abnormality portent detection system 100 shifts and changes the boundary of the abnormality occurrence period from the actual abnormality occurrence timing, and extracts a parameter showing a change where the contribution rate to the transition from the state before the boundary to the state after the boundary of the manufacturing apparatus 10 is maximized before the abnormality occurrence timing. Therefore, the parameter (the monitoring item) to be used to detect the portent of the abnormality occurrence of the manufacturing apparatus 10 can be extracted, and the portent of the abnormality occurrence of the manufacturing apparatus 10 can be efficiently detected. As a result, the portent of the abnormality occurrence of the manufacturing apparatus 10 can be detected in addition to the portent of the degradation of the consumable part, and the prevention of the quality abnormality and the effective utilization of the consumable part both can be achieved.

In addition, in the embodiment, the abnormality portent detection system 100 determines, for the extracted parameter, the threshold which is used to detect the portent of the abnormality occurrence of the manufacturing apparatus 10 according to the parameter value at the timing at which the contribution rate becomes the maximum value. For example, the abnormality portent detection system 100 determines the threshold such that the portent of the abnormality occurrence of the manufacturing apparatus 10 is detected near the timing at which the contribution rate becomes the maximum value. Therefore, even though the parameter value falls within the normal range, a parameter showing the portent behavior of the abnormality occurrence can be captured, and the portent of the abnormality occurrence can be detected using the parameter. In other words, the abnormality occurrence of the manufacturing apparatus 10 can be predicted in an earlier stage, and the deterioration of the yield can be suppressed (for example, at a minimum level).

In addition, in the embodiment, the abnormality portent detection system 100 determines, for the extracted parameter, the portent time from the timing at which the portent of the abnormality occurrence of the manufacturing apparatus 10 is detected to the abnormality occurrence timing based on the timing of the maximum value of the contribution rate and the abnormality occurrence timing. Therefore, since the abnormality occurrence timing can be predicted based on the timing at which the portent of the abnormality occurrence is detected, the manufacturing apparatus can be used immediately before the abnormality occurrence timing for example, and the running cost of the consumable part can be more reduced while preventing the quality abnormality in advance.

It should be noted that, although the description in the above embodiment has been made about a case where one day (24 hours) is used as a unit of time (a unit of process date) to collect the parameter, the unit of time to collect the parameter may be shorter than one day (24 hours), or may be longer than one day (24 hours).

Alternatively, the description in the above embodiment has been made about a case where the boundary between the normal period and the abnormality occurrence period is changed before and after the abnormality occurrence timing (see the solid and dashed white arrows of FIG. 2), but it is sufficient that the boundary between the normal period and the abnormality occurrence period is changed before the abnormality occurrence tinting in order to capture the portent behavior. Therefore, for each of the plural kinds of parameters, the calculation unit 131 (see FIG. 1) may not change the boundary in a direction after the abnormality occurrence timing (see the dashed white arrow of FIG. 2), but change the boundary in a direction going back in time from the abnormality occurrence timing (see the solid white arrow of FIG. 2).

Alternatively, the description in the above embodiment has been made about a case where when there are two or more kinds of the parameters F1 and F2 showing a change in which the contribution rate has the maximum value at a timing before the abnormality occurrence timing with respect to the time of the boundary (see FIG. 10), one parameter is selected and extracted from among the two or more kinds parameters. However, the number of appropriate parameters among the two or more kinds of parameters may be changed depending on a monitor policy of the user. Therefore, the extraction unit 132 (see FIG. 1) may extract two or more kinds of parameters (as candidates of the monitoring item) showing a change in which the contribution rate has the maximum value at a timing before the abnormality occurrence timing with respect to the time of the boundary among the plural kinds of parameters. For example, in a case where the collection unit 111 (see FIG. 1) collects the parameters of the variation characteristics 22 to 25 as illustrated in FIG. 9, the extraction unit 132 can confirm a change of the contribution rate to the time (the process date) of the boundary as illustrated in FIG. 10 based on the calculation result of the calculation unit 131. FIG. 9 is a diagram illustrating the time-sequential variation characteristics 21 to 25 of the parameter related to the state of the manufacturing apparatus 10. FIG. 10 is a diagram illustrating a change of the contribution rate to the time (the process date) of the boundary with respect to the manufacturing apparatus 10-1 for example.

In other words, in the case of FIG. 10, the flow rate F1 and the flow rate F2 among the parameters T1, P1, F1, and F2 show a change in which the contribution rate has the maximum value at the timings (the process dates 'ta–3' and 'ta–4') before the abnormality occurrence timing (the process date 'ta') of the manufacturing apparatus 10 with respect to the time (the process date) of the boundary. In other words, the flow rate F1 and the flow rate F2 each show a change of forming an upwardly convex curve to have a peak value before the abnormality occurrence timing (the process date 'ta'). The temperature T1 and the pressure P1 do not show such a change. Therefore, in the case of FIG. 10, the extraction unit 132 extracts the flow rate F1 and the flow rate F2 among the parameters T1, P1, F1, and F2 as the parameters (the candidates) to be used to detect the portent of the abnormality occurrence of the manufacturing apparatus 10. In addition, the extraction unit 132 may extract peak contribution rates PKf1 and PKf2 of the extracted parameters F1 and F2.

At this time, the first determination unit 133 (see FIG. 1) can determine the thresholds which are used to detect the portent of the abnormality occurrence of the manufacturing apparatus 10 with respect to two or more extracted parameters. For example, in the case illustrated in FIG. 10, the timing of the maximum value of the contribution rate of the flow rate F1 is the process date 'ta–3' (that is, three days ago before the abnormality occurrence timing ta). The timing of the maximum value of the contribution rate of the flow rate F2 is the process date 'ta–4' (that is, four days ago before the abnormality occurrence timing 'ta'). The first determination unit 133 determines the threshold THf1 such that the portent behavior is detected at the process date 'ta–3' in the variation characteristic 24 of the flow rate F1 as illustrated in FIG. 9. As illustrated in FIG. 9, for example, the threshold THf1 can be set to a value within the normal range between the upper control limit UCL-3 and the lower control limit LCL-3. The first determination unit 133 determines a threshold THf2 such that the portent behavior is detected at the process date 'ta–4' in the variation characteristic 25 of the flow rate F2 as illustrated in FIG. 9. As illustrated in FIG. 9, for example, the threshold THf2 can be set to a value within the normal range between an upper control limit UCL-4 and a lower control limit LCL-4.

In addition, the second determination unit 134 FIG. 1) can determine, for each of the two or more kinds of extracted parameters, the portent time from the timing at which the portent of the abnormality occurrence of the manufacturing apparatus is detected to the abnormality occurrence timing based on the timing of the maximum value of the contribution rate and the abnormality occurrence timing. For example, in the case illustrated in FIG. 10, the timing of the maximum value of the contribution rate of the flow rate F1 is the process date 'ta–3' (that is, three days ago before the abnormality occurrence timing ta). The timing of the maximum value of the contribution rate of the flow rate F2 is the process date 'ta–4' (that is, four days ago before the abnormality occurrence timing ta). At this time, the second determination unit 134 can determine three days as the portent time (the number of portent days) of the flow rate F1 from the timing at which the portent of the abnormality occurrence of the manufacturing apparatus 10 is detected to the abnormality occurrence timing, and can determine four days as the portent time (the number of portent days) of the flow rate F2.

Then, the generation unit 135 (see FIG. 1), for example, can generate portent parameter information 135a' which has data structure as illustrated in FIG. 11. FIG. 11 is a diagram illustrating the data structure of the portent parameter information 135a'. The portent parameter information 135a' includes information in which a peak contribution rate value is further associated in addition to the identifier of the manufacturing apparatus 10, the identifier of the parameter, the value of the threshold, and the value of the portent time. The portent parameter information 135a' further includes a peak contribution rate column 135a5 compared to the portent parameter information 135a (see FIG. 5). When referring the portent parameter information 135a', for example, it can be seen that the portent of the abnormality occurrence of the manufacturing apparatus 10-1 can be detected three days ago before the abnormality occurrence timing at the upper limit threshold THf1 of the flow rate F1, and can be detected four days ago before the abnormality occurrence timing at the upper limit threshold THf2 of the flow rate 52. In addition, it can be seen that there are the peak contribution rates PKf1 and PKf2 (for example, PKf1<PKf2 as illustrated in FIG. 10) of the flow rate F1 and the flow rate F2.

Therefore, the user who browses the portent parameter information 135a' on the display screen 20a of the user terminal 20 can select an appropriate parameter depending on the monitor policy from among the two or more kinds of extracted parameters, and can transmit the monitor request containing the selection instruction to the monitor unit 136 through the user terminal 20 and the communication line.

For example, in a case where the user employs a monitor policy of giving priority to a parameter having a large maximum value of the contribution rate, the selection instruction is made to select the parameter F2 having the largest maximum value of the contribution rate. Therefore, it is possible to monitor a parameter which shows the most prominent portent behavior of the abnormality occurrence of the manufacturing apparatus 10 and which is easily monitored among the parameters showing the maximum values before the abnormality occurrence timing.

Alternatively, in a case where the user employs a monitor policy of giving priority to a parameter of which the contribution rate has a timing of the maximum value nearest to the abnormality occurrence timing, the selection instruction is made to select the parameter F1 of which the contribution rate has a timing of the maximum value nearest to the abnormality occurrence timing. Therefore, it is possible to monitor a parameter which shows the portent behavior of the abnormality occurrence of the manufacturing apparatus 16 is nearest to the abnormality occurrence timing and which is suitable for reducing the running cost of the consumable part among the parameters showing the maximum values before the abnormality occurrence timing.

Figure 12:
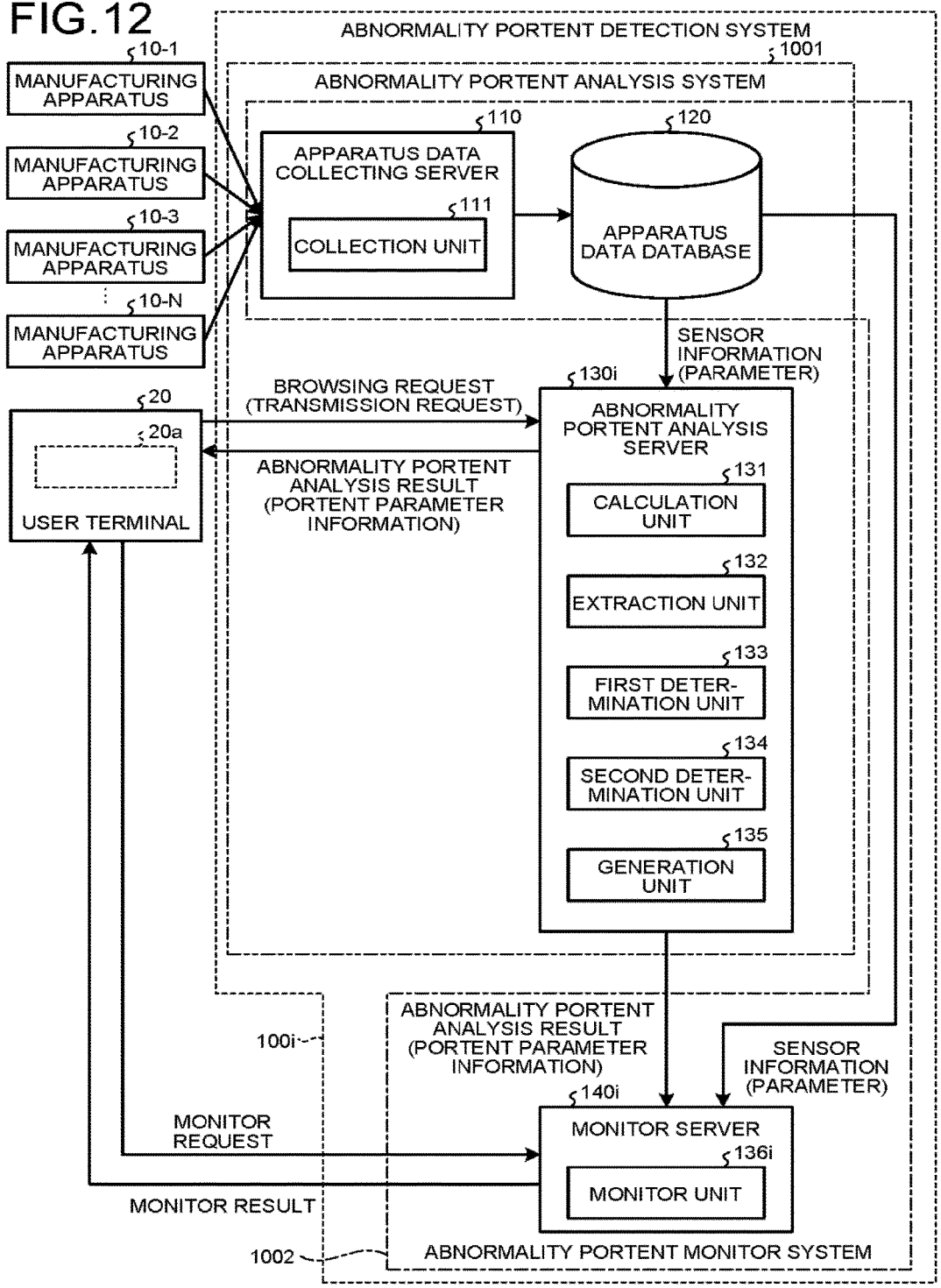
FIG. 12 is a diagram illustrating a configuration of an abnormality portent detection system according to another modification of the embodiment.

Alternatively, as illustrated in FIG. 12, a system (an abnormality portent analysis system 1001) which performs the analysis process and a system (an abnormality portent monitor system 1002) which performs the monitor process may be separately configured with respect to each other in an abnormality portent detection system 100*i*. FIG. 12 is a diagram illustrating a configuration of the abnormality portent detection system 100*i* according to a modification. For example, the abnormality portent analysis system 1001 includes the apparatus data collecting server 110, the apparatus data database 120, and an abnormality portent analysis server 130*i*. The abnormality portent analysis server 130*i* is different from the abnormality portent analysis server 130 (see FIG. 1) in that the monitor unit 136 is not included. The abnormality portent monitor system 1002 includes the apparatus data collecting server 110, the apparatus data database 120, and a monitor server 140*i*. The apparatus data collecting server 110 and the apparatus data database 120 are shared by the abnormality portent analysis system 1001 and the abnormality portent monitor system 1002. The monitor server 140*i* includes a monitor unit 136*i*. The function of the monitor unit 136*i* is basically equal to that of the monitor unit 136 (see FIG. 1). The monitor unit 1361 may be realized in hardware as a circuit in the monitor server 140*i*, or may be realized in software as a function module which is developed in the monitor server 140*i*.

In the abnormality portent detection system 100*i* illustrated in FIG. 12, the generation unit 135 may transmit the portent parameter information 135*a* to the monitor unit 136*i* through a wired or wireless communication line when the portent parameter information 135*a* is generated. Alternatively, when a transmission request is received from the user terminal 20 through a wired or wireless communication line, the generation unit 135 may transmit the portent parameter information 135*a* to the monitor unit 136*i* through a wired or wireless communication line. Even in such an abnormality portent detection system 100*i*, the parameter (the monitoring item) to be used to detect the portent of the abnormality occurrence of the manufacturing apparatus 10 can be extracted, and the portent of the abnormality occurrence of the manufacturing apparatus 10 can be efficiently detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An abnormality portent detection system comprising:
   a collection unit configured to time-sequentially collect plural kinds of parameters, the plural kinds of parameters corresponding to a plurality of sensors attached to a first apparatus which processes a substrate, the plural kinds of parameters being output from the plurality of sensors, each of the plural kinds of parameters indicating a physical status relating to whether an operational state of the first apparatus is normal or not, each of the plural kinds of parameters having an upper control limit and a lower control limit, both of the upper control limit and the lower control limit being determined depending on a range of values obtainable of the sensor in a normal operational status of the first apparatus;
   a calculation unit configured to calculate, while temporally changing a boundary between a first period and a second period in a time-sequential variation characteristic of each of the plural kinds of parameters, a contribution rate of each of the plural kinds of parameters with respect to a transition from a first state of the first apparatus before the boundary to a second state of the first apparatus after the boundary;
   an extraction unit configured to extract, among the plural kinds of parameters, a parameter showing a change where the contribution rate has a maximum value at a timing before an abnormality occurrence timing of the first apparatus with respect to a time of the boundary, based on a result of the calculation by the calculation unit; and
   a generation unit configured to generate portent parameter information with which the extracted parameter is associated as a parameter to be used to detect a portent of an abnormality occurrence of the first apparatus.

2. The abnormality portent detection system according to claim 1, further comprising:
   a first determination unit configured to determine a threshold which is used to detect the portent of the abnormality occurrence of the first apparatus with respect to the extracted parameter, the threshold being a value between the upper control limit and the lower control limit,
   wherein the generation unit generates the portent parameter information in which the extracted parameter is further associated with the threshold.

3. The abnormality portent detection system according to claim 2,
   wherein the first determination unit determines the threshold used to detect the portent of the abnormality occurrence of the first apparatus according to a value of the extracted parameter at a timing of the maximum value of the contribution rate.

4. The abnormality portent detection system according to claim 3,
   wherein the first determination unit determines the threshold such that the portent of the abnormality occurrence of the first apparatus is detected near a timing of the maximum value of the contribution rate.

5. The abnormality portent detection system according to claim 1, further comprising:
a second determination unit configured to determine, with respect to the extracted parameter, a portent time, based on a timing of the maximum value of the contribution rate and the abnormality occurrence timing, the portent time indicating a time from a detection timing to the abnormality occurrence timing, the detection timing being a timing at which the portent of the abnormality occurrence of the first apparatus is detected,
wherein the generation unit generates the portent parameter information in which the extracted parameter is further associated with the portent time.

6. The abnormality portent detection system according to claim 1,
wherein the calculation unit changes the boundary from the abnormality occurrence timing at least in a direction going back in time with respect to each of the plural kinds of parameters.

7. The abnormality portent detection system according to claim 1,
wherein if, among the plural kinds of parameters, there are a plurality of parameters showing a change where the contribution rate has a maximum value at a timing before the abnormality occurrence timing with respect to the time of the boundary, the extraction unit extracts, as a parameter to be used to detect the portent of the abnormality occurrence of the first apparatus, a parameter of which the contribution rate has the largest maximum value among the plural kinds of parameters.

8. The abnormality portent detection system according to claim 1,
wherein if, among the plural kinds of parameters, there are a plurality of parameters showing a change where the contribution rate has a maximum value at a timing before the abnormality occurrence timing with respect to the time of the boundary, the extraction unit extracts, as a parameter to be used to detect the portent of the abnormality occurrence of the first apparatus, a parameter of which the contribution rate has a timing of the maximum value nearest to the abnormality occurrence timing, among the plural kinds of parameters.

9. The abnormality portent detection system according to claim 1,
wherein the extraction unit extracts two or more kinds of parameters showing a change where the contribution rate has a maximum value at a timing before the abnormality occurrence timing with respect to the time of the boundary among the plural kinds of parameters.

10. The abnormality portent detection system according to claim 9,
wherein the generation unit generates the portent parameter information in which each of the two or more kinds of extracted parameters is associated as a parameter to be used to detect the portent of the abnormality occurrence of the first apparatus.

11. The abnormality portent detection system according to claim 9, further comprising:
a first determination unit configured to determine a threshold which is used to detect the portent of the abnormality occurrence of the first apparatus with respect to each of the two or more kinds of extracted parameters,
wherein the generation unit generates the portent parameter information in which each of the two or more kinds of extracted parameters is further associated with the threshold.

12. The abnormality portent detection system according to claim 9, further comprising:
a second determination unit configured to determine a portent time from a timing at which the portent of the abnormality occurrence of the first apparatus is detected to the abnormality occurrence timing, based on a timing of the maximum value of the contribution rate and the abnormality occurrence timing, with respect to each of the two or more kinds of extracted parameters,
wherein the generation unit generates the portent parameter information in which each of the two or more kinds of extracted parameters is further associated with the portent time.

13. The abnormality portent detection system according to claim 9,
wherein the extraction unit extracts the maximum value of the contribution rate with a parameter, and
the generation unit generates the portent parameter information in which each of the two or more kinds of extracted parameters is further associated with the maximum value.

14. The abnormality portent detection system according to claim 1,
wherein the calculation unit obtains a first vector obtained by subtracting a vector indicating the first state from a vector indicating the second state with respect to a plurality of primary components obtained by multiplying a coefficient to each of the plural kinds of parameters, and calculates the contribution rate of a predetermined parameter based on the first vector and a second vector including a coefficient of the predetermined parameter.

15. The abnormality portent detection system according to claim 14,
wherein the calculation unit calculates a magnitude of a projection component of the second vector toward the first vector as the contribution rate of the predetermined parameter.

* * * * *